(12) United States Patent
Zhan et al.

(10) Patent No.: US 10,750,292 B2
(45) Date of Patent: Aug. 18, 2020

(54) MEMS MICROPHONE CHIP AND MEMS MICROPHONE

(71) Applicant: GOERTEK, INC., Weifang, Shandong (CN)

(72) Inventors: Junkai Zhan, Weifang (CN); Jianglong Li, Weifang (CN); Mengjin Cai, Weifang (CN)

(73) Assignee: Goertek, Inc., Weifang, Shandong (CN)

( * ) Notice: Subject to any disclaimer, the term of this patent is extended or adjusted under 35 U.S.C. 154(b) by 0 days.

(21) Appl. No.: 16/465,756

(22) PCT Filed: Mar. 3, 2017

(86) PCT No.: PCT/CN2017/075594
§ 371 (c)(1),
(2) Date: May 31, 2019

(87) PCT Pub. No.: WO2018/103208
PCT Pub. Date: Jun. 14, 2018

(65) Prior Publication Data
US 2019/0394574 A1    Dec. 26, 2019

(30) Foreign Application Priority Data

Dec. 5, 2016  (CN) .......................... 2016 1 1103457

(51) Int. Cl.
*H04R 19/04* (2006.01)
*B81B 7/00* (2006.01)
(Continued)

(52) U.S. Cl.
CPC ............ *H04R 19/04* (2013.01); *B81B 7/0029* (2013.01); *H04R 1/04* (2013.01); *H04R 19/005* (2013.01);
(Continued)

(58) Field of Classification Search
CPC .......................... H04R 19/005; H04R 19/04; H04R 2201/003; H04R 31/00; H04R 1/04;
(Continued)

(56) References Cited

U.S. PATENT DOCUMENTS

2014/0133685 A1*  5/2014  Liu ...................... B81B 3/0056
                                                  381/355
2015/0146906 A1*  5/2015  Je ............................ H04R 7/02
                                                  381/369

\* cited by examiner

*Primary Examiner* — Fan S Tsang
*Assistant Examiner* — Julie X Dang
(74) *Attorney, Agent, or Firm* — Baker Botts, L.L.P.

(57) ABSTRACT

Provided are a MEMS microphone chip and an MEMS microphone. The MEMS microphone chip comprises a substrate, a backplate and a vibration diaphragm, the backplate and the vibration diaphragm constituting two electrodes of a capacitor respectively, the backplate and the vibration diaphragm being suspended above the substrate, the backplate being located between the substrate and the vibration diaphragm, and the substrate being provided with a back chamber and a support column, the support column being connected to a side wall of the back chamber via a connection portion, a through hole or a notch being formed in the connection portion through its thickness direction, to allow spaces at opposite sides of the connection portion to communicate with each other; and the support column being configured to support the backplate.

9 Claims, 4 Drawing Sheets

(51) Int. Cl.
*H04R 1/04* (2006.01)
*H04R 19/00* (2006.01)

(52) U.S. Cl.
CPC ............... *B81B 2201/0257* (2013.01); *B81B 2203/0127* (2013.01); *B81B 2203/033* (2013.01); *B81B 2203/0353* (2013.01); *H04R 2201/003* (2013.01); *H04R 2307/025* (2013.01)

(58) Field of Classification Search
CPC .................. H04R 31/006; H04R 2499/11; H04R 31/003; H04R 1/222; H04R 7/04; B81B 7/02; B81B 2201/0264; B81B 3/001; B81B 3/0018; B81B 7/0032; B81B 2201/0214; B81B 2201/0221; B81B 2203/033; B81B 2203/0353; B81B 2203/04; B81B 2207/015; B81B 2201/0278
USPC .................................................. 381/170–175
See application file for complete search history.

MEMS MICROPHONE CHIP AND MEMS MICROPHONE

CROSS-REFERENCE TO RELATED APPLICATIONS

This application is a National Stage of International Application No. PCT/CN2017/075594, filed on Mar. 3, 2017, which claims priority to Chinese Patent Application No. 201611103457.0, filed on Dec. 5, 2017, both of which are hereby incorporated by reference in their entireties.

TECHNICAL FIELD

The present disclosure relates to the field of MEMS (Micro Electro Mechanical System), and more particularly to an MEMS microphone chip and an MEMS microphone employing the same.

BACKGROUND

A conventional MEMS microphone mainly takes silicon or polycrystalline silicon as a structural material to form a vibration diaphragm or a backplate. The backplate and the vibration diaphragm are disposed on a common substrate with a back chamber in which a support column is disposed. The support column is usually connected to a side wall. A connection portion partitions the back chamber. Some dust may enter the microphone during production, which adversely affects the product quality. In order to clean the dust, an air gun needs to be used for cleaning a PCB (Printed Circuit Board) during assembly.

In a blowing process, since the back chamber is partitioned by the connection portion, a transverse motion of the blown airflow is obstructed, resulting in a local high pressure which may further damage the connection portion, the backplate or the vibration diaphragm. As a result, the microphone fails to work. The yield is reduced consequently.

Thus, it is necessary to provide a solution to improve the anti-blowing capability of the MEMS microphone.

SUMMARY

An objective of the present disclosure is to provide a new technical solution of an MEMS microphone chip.

According to a first aspect of the present disclosure, there is provided an MEMS microphone chip, including a substrate, a backplate and a vibration diaphragm. The backplate and the vibration diaphragm constitute two electrodes of a capacitor respectively and are suspended above the substrate. The backplate is located between the substrate and the vibration diaphragm. The substrate is provided with a back chamber and a support column. The support column is connected to a side wall of the back chamber via a connection portion. A through hole or a notch is formed in the connection portion through its thickness direction, to allow spaces at opposite sides of the connection portion to communicate with each other. The support column is configured to support the backplate.

Optionally, the connection portion is gradually reduced in an axial direction of the support column from the side wall to the support column.

Optionally, the connection portion is gradually reduced in an axial direction of the support column from the support column to the side wall.

Optionally, a notch which formed in the connection portion is fan-shaped.

Optionally, the notch is located in a side of the connection portion that is close to the backplate.

Optionally, the notch or the through hole is formed in the connection portion under a reaming effect of inductively coupled plasma etching.

Optionally, the through hole or the notch is circular, elliptical, rectangular or triangular.

Optionally, the substrate is integrally formed.

Optionally, at least one of the backplate and the vibration diaphragm is made of polycrystalline silicon, monocrystalline silicon or metallic glass.

According to another aspect of the present disclosure, there is provided an MEMS microphone, including a package structure and the MEMS microphone chip provided by the present disclosure. The MEMS microphone chip is disposed in the package structure.

The inventor of the present disclosure discovers that in the prior art, since a support column of a substrate is connected to a side wall through a connection portion, and a back chamber is partitioned by the connection portion, a transverse motion of blown airflow is obstructed, resulting in damage to the MEMS microphone chip. Thus, a technical task to be implemented or a technical problem to be solved by the present disclosure is that never been thought of or expected by those skilled in the art. Hence, the present disclosure is a new technical solution.

According to the MEMS microphone chip provided by the present disclosure, the support column of the back chamber is connected to the side wall through the connection portion so as to support the backplate. The through hole or the notch is formed in the connection portion through its thickness direction, to allow spaces at opposite sides of the connection portion to communicate with each other. Owing to this structure, the connection portion may not obstruct a transverse motion of blown airflow. Thus, the MEMS microphone chip is effectively prevented from being adversely affected by the side wall of the substrate. The characteristic of a microphone will not decline. The anti-blowing capability of the MEMS microphone chip is greatly improved.

Besides, owing to this structure, the yield of the MEMS microphone chip is increased.

Further features of the present disclosure and advantages thereof will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the specification, illustrate embodiments of the disclosure and, together with the description thereof, serve to explain the principles of the disclosure.

Figure 1:
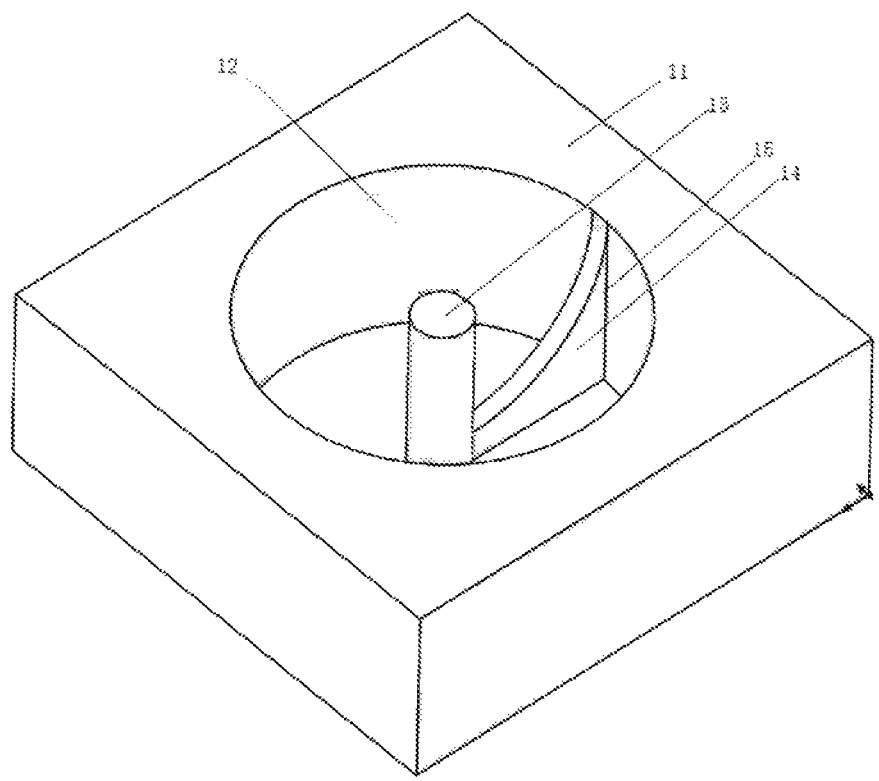
FIG. 1 is a schematic structural view of a substrate according to an embodiment of the present disclosure.

Reference numerals in the drawings are described as below: substrate—11; back chamber—12; support column—13; connection portion—14; side wall—15; notch—16; vibration diaphragm—17; backplate—18; sacrificial layer—19; solder pad—20; penetration port—21; protective layer—22; vibration clearance—23; through hole—24; etching region—25; channel—26.

DETAILED DESCRIPTION

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

To solve at least one of the above problems, the present disclosure provides an MEMS microphone chip, including a substrate 11, a backplate 18 and a vibration diaphragm 17. The backplate 18 and the vibration diaphragm 17 constitute two electrodes of a capacitor. Optionally, at least one of the backplate 18 and the vibration diaphragm 17 is made of polycrystalline silicon, monocrystalline silicon or metallic glass. The above-mentioned materials have electric conductivity, and therefore facilitate formation of the capacitor. The metallic glass has the characteristic of a high limit of elasticity. The limit of elasticity means the ability of a material to return to its original state after deformation. With a higher limit of elasticity, the material can still return to its original state after a greater deformation. The metallic glass may be but not limited to Pd, Cu, Zr, Al, Fe, Co, Ni, Mg, Zn, Ca, Yb or Ce. Owing to the foregoing characteristics, the metallic glass is particularly applicable for the vibration diaphragm 17.

A vibration clearance 23 is formed between the vibration diaphragm 17 and the backplate 18 to allow the vibration diaphragm 17 to vibrate. The backplate 18 and the vibration diaphragm 17 are suspended above the substrate 11. The backplate 18 is located between the substrate 11 and the vibration diaphragm 17. Preferably, penetration ports 21 are formed in the backplate 18 in its thickness direction. When the vibration diaphragm 17 vibrates, the pressure in the vibration clearance 23 is unstable and forms a pressure difference with the external environment. This pressure difference may easily cause the vibration diaphragm 17 to be broken. In order to solve this technical problem, the penetration ports 21 are formed in the backplate 18 to balance air pressures inside and outside the vibration clearance 23. Thus, the vibration diaphragm 17 is protected against breakage.

The substrate 11 is provided with a back chamber 12 and a support column 13. The support column 13 is connected to a side wall 15 of the back chamber 12 through a connection portion 14. The support column 13 is configured to support the backplate 18. A through hole 24 or a notch 16 is formed in the connection portion 14 through its thickness direction, to allow spaces at opposite sides of the connection portion 14 to communicate with each other.

During use, a sound in the external environment enters from one side of the vibration diaphragm 17 to bring the vibration diaphragm 17 to vibrate. The vibration diaphragm 17 is deformed, as a result of which a distance between the vibration diaphragm 17 and the backplate 18 is changed, resulting in an output of a varying electric signal at last. Thus, the sound signal is converted into the electric signal.

According to the MEMS microphone chip provided by the present disclosure, the support column 13 of the back chamber 12 is connected to the side wall 15 via the connection portion 14 so as to support the backplate 18. The through hole 24 or the notch 16 is formed in the connection portion 14 through its thickness direction, to allow the spaces at opposite sides of the connection portion 14 to communicate with each other. Owing to this structure, the connection portion 14 may not obstruct a transverse motion of blown airflow in a blowing process. Thus, the MEMS microphone chip is effectively prevented from being adversely affected by the side wall 15 of the substrate 11. The characteristic of a microphone will not decline. The anti-blowing capability of the MEMS microphone chip is greatly improved. The transverse motion of the blown airflow means a motion in a direction perpendicular to the support column 13.

Besides, owing to this structure, the yield of the MEMS microphone chip is increased.

Figure 5:
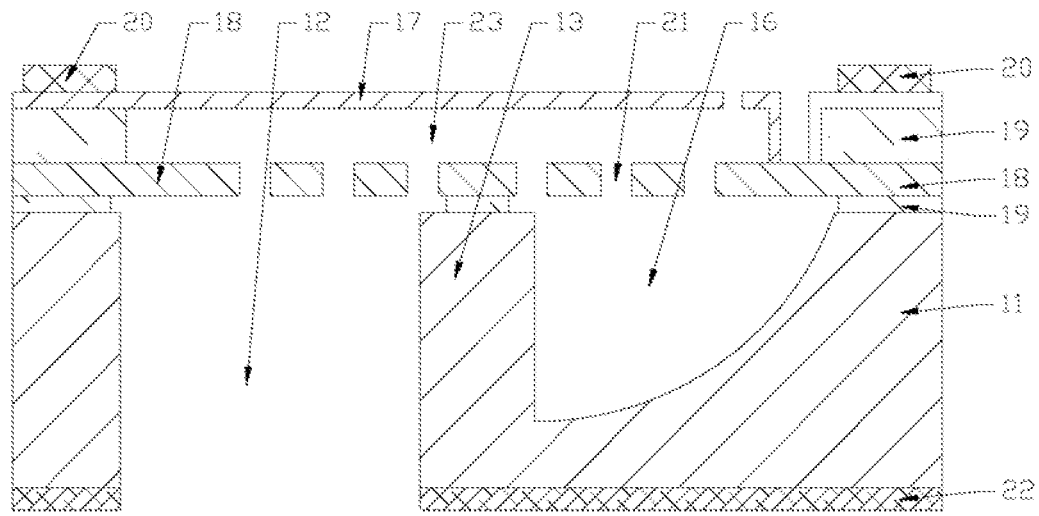

FIG. 5 shows an MEMS microphone chip according to an embodiment of the present disclosure. In this embodiment, the vibration diaphragm 17 is made of monocrystalline silicon or polycrystalline silicon. The substrate 11 is made of monocrystalline silicon. A solder pad 20 is made of a conductive material, e.g., copper, aluminum, gold or silver. The two solder pads 20 are electrically connected to the vibration diaphragm 17 and the substrate 11 respectively.

FIG. 1 shows the substrate 11 according to an embodiment of the present disclosure. The support column 13 is disposed in the middle of the back chamber 12 and connected to the side wall 15 through the connection portion 14 to form a supporting force. In this structure, the size of the connection portion 14 in an axial direction of the support column 13 is gradually reduced from the side wall 15 to the support column 13 to form the notch 16. The size of the notch 16 may be set according to actual demands. For example, the notch 16 is fan-shaped. A larger pass-through area of the fan shape is beneficial to the transverse motion of the blown airflow. Besides, the fan-shaped notch 16 has more excellent hydrodynamic behaviors, so the blown airflow is easy to spread. Preferably, the notch 16 is located in the side, close to the backplate 18, of the connection portion 14. An adverse effect on the airflow from the connection portion 14 and the side wall 15 is further reduced. The anti-blowing capability of the MEMS microphone chip is improved. Certainly, the notch 16 may also be triangular, which facilitates machining.

In order to guarantee the structural strength of the substrate 11, in one example, the substrate 11 is integrally formed. Preferably, the notch 16 or the through hole 24 is formed in the connection portion 14 by means of inductively coupled plasma etching. This method utilizes a reaming effect of an inductively coupled plasma etcher. Under the action of the reaming effect, the substrate 11 may be hollowed out, only retaining the very bottom of the connection portion 14 and the support column 13. The notch 16 is formed in a side of the connection portion 14 that is adjacent to the backplate 18.

It should be pointed out that in the present disclosure, the reaming effect is utilized to form the notch 16 or the through hole 24 in the connection portion, such that people's prejudice against the reaming effect is changed. In a conventional machining process, people usually hope to reduce the reaming effect because it may reduce the machining accuracy. However, the method adopted by the present disclosure realizes forming of the notch 16 or the through hole 24 in the connection portion right by etching in a three-dimensional space caused by the reaming effect. Thus, the anti-blowing capability of the MEMS microphone chip is improved.

Further, the thickness of the connection portion 14 is smaller than or equal to an external diameter of the support column 13. Due to this, the area of airflow obstruction by the connection portion 14 is further reduced, such that the adverse effect on the blown airflow from the connection portion 14 and the side wall 15 is less. The thinner the connection portion 14 is, the less the adverse effect on the blown airflow is, and the lower the structural strength is. Thus, the supporting force of the support column 13 is reduced. The thicker the connection portion 14 is, the more the adverse effect on the blown airflow is, and the higher the strength is. Therefore, the thickness of the connection portion 14 should be set in balanced consideration.

FIGS. 2-5 illustrate a manufacturing method of the MEMS microphone chip, including the following steps.

Figure 2:
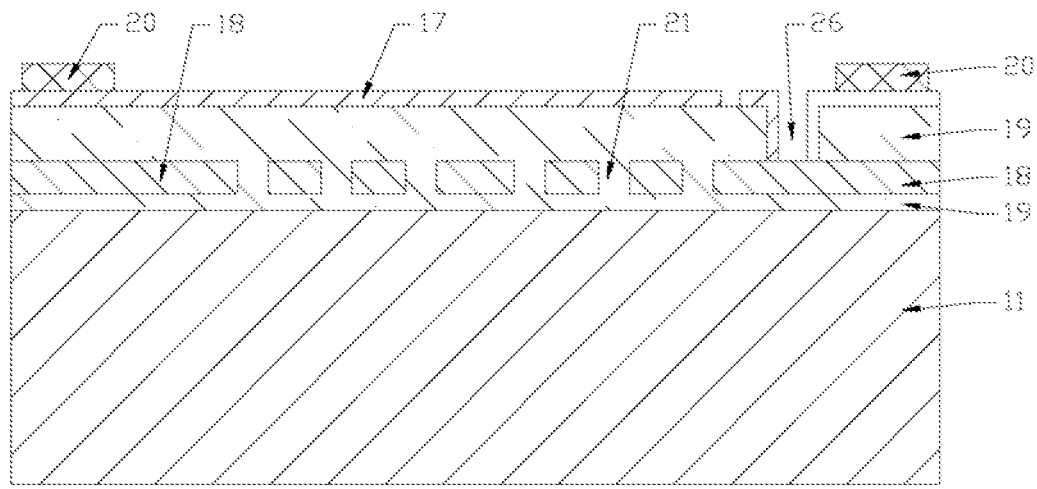
FIGS. 2-5 are flow charts of a manufacturing method of an MEMS microphone chip according to an embodiment of the present disclosure.
Figure 3:
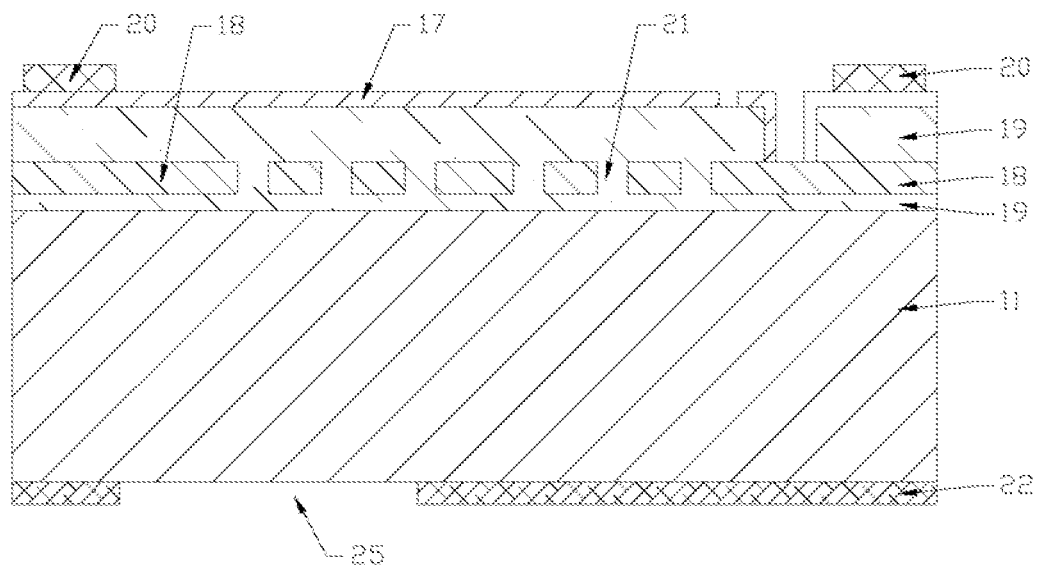

S1. Referring to FIG. 2, a sacrificial layer 19 and a backplate 18 are sequentially deposited on a substrate 11. The backplate 18 is etched by means of particle beams for example to form a penetration port 21. In addition to the capability of balancing air pressure during use, the penetration port 21 can also enable an etchant to enter a gap between the backplate 18 and a vibration diaphragm 17 in the follow-up etching procedure to etch the sacrificial layer 19.

S2. Referring to FIG. 2, the sacrificial layer 19 which is made from silicon dioxide or aluminum is continuously deposited on the backplate 18 and locally etched to form a channel 26 communicated with the backplate 18. In this step, the thickness of the sacrificial layer 19 determines the height of a vibration clearance 23.

S3. Referring to FIG. 2, the vibration diaphragm 17 and a solder pad 20 are sequentially deposited on the sacrificial layer 19. The vibration diaphragm 17 is made from such a conductive material as monocrystalline silicon, polycrystalline silicon or metallic glass. The conductive material is deposited on the channel 26 formed in S2 in the deposition process to facilitate electric connection between the solder pad 20 and the backplate 18. Another solder pad 20 is directly deposited at an edge of the vibration diaphragm 17. It should be pointed out that the vibration diaphragm 17 and the conductive material for electric connection with the solder pad 20 need to be partitioned to avoid forming a short circuit.

Figure 4:
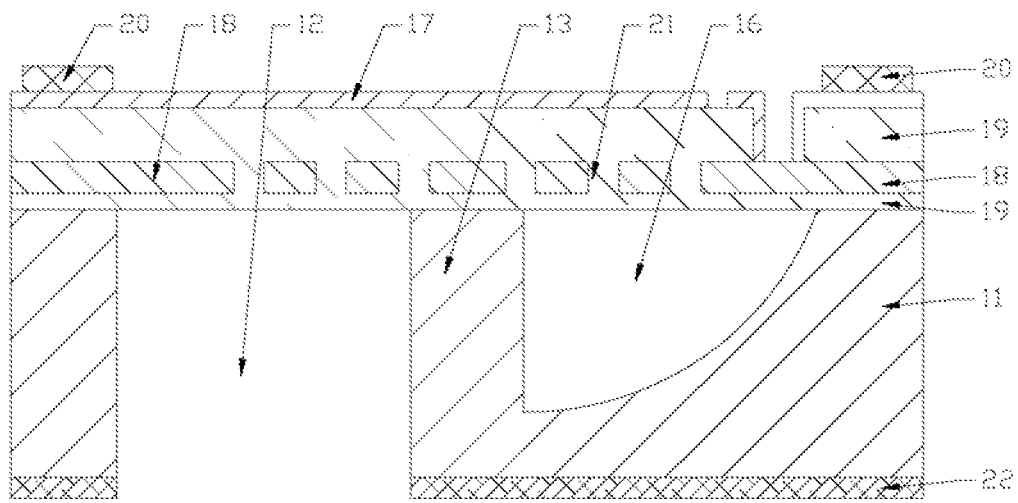

S4. Referring to FIG. 4, a protective layer 22 is deposited at the bottom of the substrate 11. An etching region 25 is reserved. The protective layer 22 may protect a region beyond the etching region 25.

S5. Referring to FIG. 4, a back chamber 12, a support column 13 and a connection portion 14 with a notch 16 are formed by means of inductively coupled plasma etching. In this step, an anisotropic deep silicon etching method is adopted. Under the action of a reaming effect of this method, etching can be formed in a three-dimensional space. A first plasma source of an anisotropic etching reaction and a second plasma source which can form a polymer covering layer through a reaction are repeatedly and alternatively utilized for operation to meet technological requirements for etching the substrate 11. For example, the first plasma source is a corrosive gas $SF_6$ (sulfur hexafluoride) and the second plasma source is a gas $C_4F_8$ (octafluorocyclobutane) of the protective layer 22. $SF_6$ can effectively perform etching to form the back chamber 12 and the notch 16 or the through hole 24. $C_4F_8$ can protect the support column 13 and the connection portion 14 against being etched.

S6. Referring to FIG. 5, part of the sacrificial layer 19 below the backplate 18 and between the backplate 18 and the vibration diaphragm 17 is etched off to form a vibration clearance 23. For example, a fluorine-containing etchant is adopted, and part of the sacrificial layer 19 is etched off by controlling the concentration and etching time of the etchant.

The present disclosure further provides other implementation modes of the MEMS microphone chip.

Figure 6:
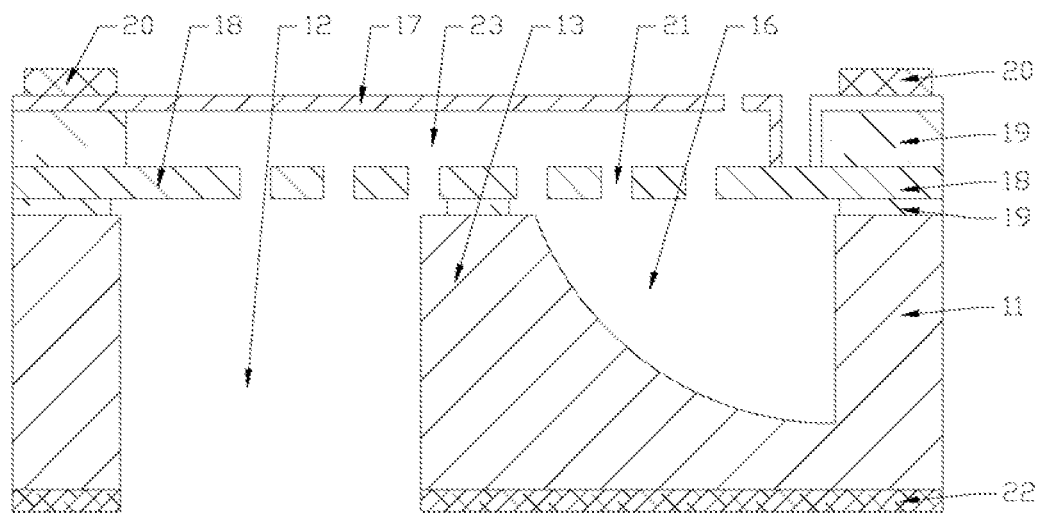
FIG. 6 is a section view of a second MEMS microphone chip according to an embodiment of the present disclosure.

In another example, as shown in FIG. 6, the size of the connection portion 14 in the axial direction of the support column 13 is gradually reduced from the support column 13 to the side wall 15 to form the notch 16. The notch 16 may be fan-shaped or triangular. Preferably, the notch 16 is located in the side, close to the backplate 18, of the connection portion 14. This structure can reduce the adverse effect on the blown airflow from the backplate 18 and the side wall 15 and improve the anti-blowing capability of the MEMS microphone chip, likewise.

Figure 7:
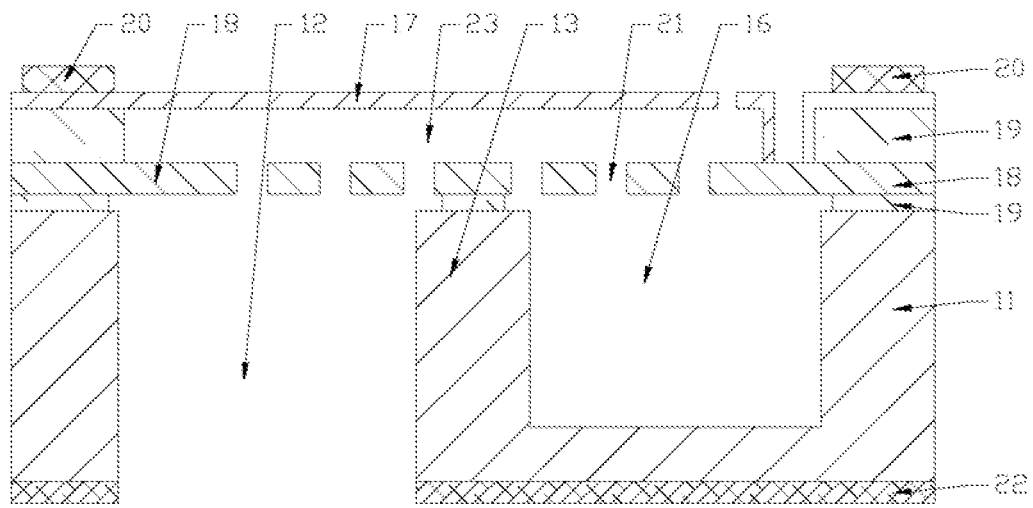
FIG. 7 is a section view of a third MEMS microphone chip according to an embodiment of the present disclosure.

In yet another example, as shown in FIG. 7, the notch 16 is rectangular. This structure can reduce the adverse effect on the blown airflow from the backplate 18 and the side wall 15 and improve the anti-blowing capability of the MEMS microphone chip, likewise. The notch 16 may also be circular, elliptical or triangular so long as the spaces at the opposite sides of the connection portion 14 are communicated and the airflow is prevented from being transversely cut off.

Figure 8:
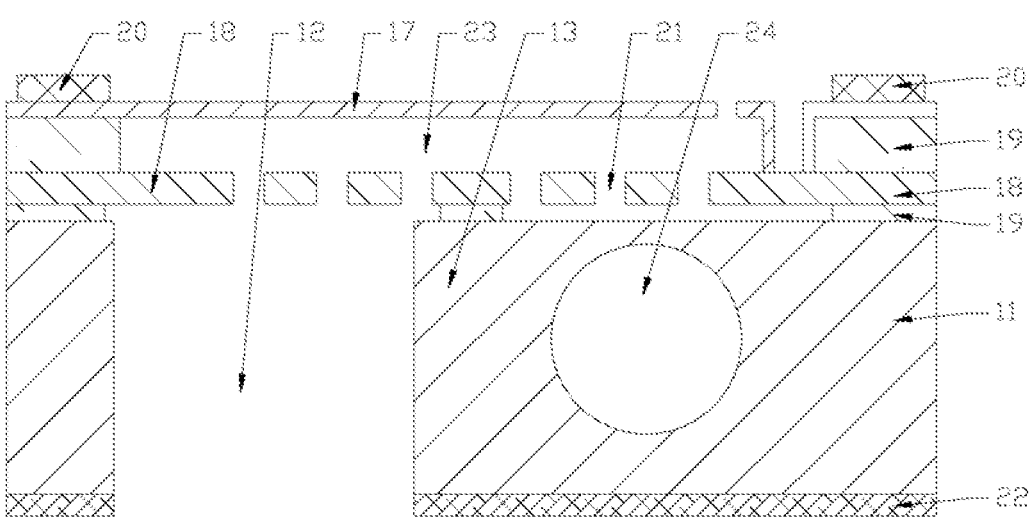
FIG. 8 is a section view of a fourth MEMS microphone chip according to an embodiment of the present disclosure.

In yet another example, as shown in FIG. 8, the notch 16 is rectangular, and the through hole 24 is formed in the connection portion 14. Optionally, the through hole 24 is circular, elliptical, rectangular or triangular. This structure can reduce the adverse effect on the blown airflow from the backplate 18 and the side wall 15 and improve the anti-blowing capability of the MEMS microphone chip, likewise.

Besides, the present disclosure further provides an MEMS microphone, including a package structure and the MEMS microphone chip provided by the present disclosure. The MEMS microphone chip is disposed in the package structure. It may be that the side, close to the vibration diaphragm, of the chip is opposite to a sound acquisition hole of the package structure, and it may also be that the back chamber of the chip is opposite to the sound acquisition hole of the package structure, which will not be limited herein so long as acquisition of ambient sound is facilitated.

The microphone has the characteristics of an excellent communication effect and a long service life.

Moreover, the present disclosure further provides an electronic device, which may be but not limited to a mobile phone, a smart watch, a tablet PC, a laptop, a virtual reality device, an interphone or the like. The electronic device includes the MEMS microphone provided by the present disclosure.

The electronic device has the characteristics of an excellent communication effect and a long service life.

Although some specific embodiments of the present disclosure have been demonstrated in detail with examples, it should be understood by a person skilled in the art that the above examples are only intended to be illustrative but not to limit the scope of the present disclosure. It should be understood by those skilled in the art that the above embodiments could be modified without departing from the scope and spirit of the present disclosure. The scope of the present disclosure is defined by the appended claims.

The invention claimed is:

1. A MEMS (Micro Electro Mechanical System) microphone chip, comprising a substrate, a backplate and a vibration diaphragm, the backplate and the vibration diaphragm constituting two electrodes of a capacitor respectively, the backplate and the vibration diaphragm being suspended above the substrate, the backplate being located between the substrate and the vibration diaphragm, and the substrate being provided with a back chamber and a support column, the support column being connected to a side wall of the back chamber via a connection portion, the connection portion having a through hole or a notch formed therein, to allow spaces at opposite sides of the connection portion to communicate with each other; and the support column being configured to support the backplate, wherein the connection portion is gradually reduced in an axial direction of the support column from the side wall to the support column.

2. A MEMS (Micro Electro Mechanical System) microphone chip, comprising a substrate, a backplate and a vibration diaphragm, the backplate and the vibration diaphragm constituting two electrodes of a capacitor respectively, the backplate and the vibration diaphragm being suspended above the substrate, the backplate being located between the substrate and the vibration diaphragm, and the substrate being provided with a back chamber and a support column, the support column being connected to a side wall of the back chamber via a connection portion, the connection portion having a through hole or a notch formed therein, to allow spaces at opposite sides of the connection portion to communicate with each other; and the support column being configured to support the backplate, wherein the connection portion is gradually reduced in an axial direction of the support column from the support column to the side wall.

3. The MEMS microphone chip according to claim 1, wherein the through hole or the notch comprises a fan shaped notch.

4. The MEMS microphone chip according to claim 1, wherein the through hole or the notch comprises a notch located in a side of the connection portion that is close to the backplate.

5. The MEMS microphone chip according to claim 1, wherein the notch or the through hole is formed in the connection portion under a reaming effect of inductively coupled plasma etching.

6. The MEMS microphone chip according to claim 1, wherein the through hole or the notch is circular, elliptical, rectangular, or triangular.

7. The MEMS microphone chip according to claim 1, wherein the substrate is integrally formed.

8. The MEMS microphone chip according to claim 1, wherein at least one of the backplate and the vibration diaphragm is made of polycrystalline silicon, monocrystalline silicon or metallic glass.

9. A MEMS microphone, comprising a package structure and a MEMS microphone chip of claim 1, wherein the MEMS microphone chip is disposed in the package structure.

* * * * *